United States Patent
Jang et al.

(10) Patent No.: US 11,417,536 B2
(45) Date of Patent: Aug. 16, 2022

(54) METHOD FOR WAFER PLANARIZATION AND AN IMAGE SENSOR MADE BY THE SAME

(71) Applicant: SAMSUNG ELECTRONICS CO., LTD., Suwon-si (KR)

(72) Inventors: Joo Hee Jang, Hwaseong-si (KR); Seok Ho Kim, Hwaseong-si (KR); Hoon Joo Na, Hwaseong-si (KR); Kwang Jin Moon, Hwaseong-si (KR); Jae Hyung Park, Hwaseong-si (KR); Kyu Ha Lee, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/439,211

(22) Filed: Jun. 12, 2019

(65) Prior Publication Data

US 2020/0168471 A1 May 28, 2020

(30) Foreign Application Priority Data

Nov. 23, 2018 (KR) .......................... 10-2018-0146663

(51) Int. Cl.
 *H01L 21/321* (2006.01)
 *H01L 27/146* (2006.01)
 *H01L 23/00* (2006.01)

(52) U.S. Cl.
CPC .... *H01L 21/3212* (2013.01); *H01L 27/14632* (2013.01); *H01L 27/14634* (2013.01);
(Continued)

(58) Field of Classification Search
CPC ... H01L 2223/5446; H01L 2224/03616; H01L 23/544; H01L 21/3212; H01L 27/14632;
(Continued)

(56) References Cited

U.S. PATENT DOCUMENTS 6,093,631 A 7/2000 Jaso et al.
9,196,851 B2 11/2015 Park et al.
(Continued)

FOREIGN PATENT DOCUMENTS

JP 2001-332556 11/2001
JP 2006-108571 4/2006
(Continued)

*Primary Examiner* — Aaron J Gray
(74) *Attorney, Agent, or Firm* — F. Chau & Associates, LLC

(57) ABSTRACT

A method for wafer planarization includes forming a second insulating layer and a polishing layer on a substrate having a chip region and a scribe lane region; forming a first through-hole in the polishing layer in the chip region and the scribe lane region and a second through-hole in the second insulating layer in the chip region, wherein the second through-hole and the first through-hole meet in the chip region; forming a pad metal layer inside the first through-hole and the second through-hole and on an upper surface of the polishing layer; and polishing the polishing layer and the pad metal layer by a chemical mechanical polishing (CMP) process to expose an upper surface of the second insulating layer in the chip region and the scribe lane region.

18 Claims, 7 Drawing Sheets

(52) U.S. Cl.
CPC ........ *H01L 27/14687* (2013.01); *H01L 24/94* (2013.01); *H01L 2224/03616* (2013.01)

(58) Field of Classification Search
CPC ............... H01L 24/94; H01L 27/14634; H01L 27/14687
See application file for complete search history.

(56) References Cited

U.S. PATENT DOCUMENTS

| | | | |
|---|---|---|---|
| 2003/0114000 A1* | 6/2003 | Noguchi | H01L 21/76834 |
| | | | 257/E21.582 |
| 2010/0258890 A1* | 10/2010 | Ahn | H01L 24/81 |
| | | | 257/E31.127 |
| 2012/0001344 A1* | 1/2012 | Takesako | H01L 21/76813 |
| | | | 257/E21.582 |
| 2012/0231564 A1* | 9/2012 | Lee | H01L 22/12 |
| | | | 257/E21.531 |
| 2014/0070183 A1 | 3/2014 | Park et al. | |

FOREIGN PATENT DOCUMENTS

| | | |
|---|---|---|
| KR | 10-1999-0025869 | 4/1999 |
| KR | 10-0739288 | 7/2007 |

\* cited by examiner

METHOD FOR WAFER PLANARIZATION AND AN IMAGE SENSOR MADE BY THE SAME

CROSS-REFERENCE TO RELATED APPLICATION

This application claims priority under 35 U.S.C. § 119 to Korean Patent Application No. 10-2018-0146663, filed on Nov. 23, 2018 the disclosure of which is incorporated by reference herein in its entirety.

1. TECHNICAL FIELD

Exemplary embodiments of the inventive concept relate to a method for wafer planarization and an image sensor made by the same.

2. DESCRIPTION OF RELATED ART

An image sensor may be formed by wafer-bonding a lower substrate including logic circuits to an upper substrate including pixels. The upper substrate and the lower substrate may be separate wafers that are bonded to each other through wafer-to-wafer bonding.

A wafer generally includes chip regions disposed in a grid form and scribe lane regions located between the chip regions. The chip region includes a plurality of devices and a plurality of lines, which are disposed below an insulating layer, and a plurality of vias electrically connected to the devices or the lines and exposed to a surface of the wafer. Thus, the chip region is formed such that the vias pass through the insulating layers and are exposed at the surface of the wafer. The scribe lane region is formed of only the insulating layers at the surface of the wafer.

In wafer-to-wafer bonding, a surface of the wafer which will be bonded (hereinafter, referred to as a "bonding surface") is first planarized by chemical mechanical polishing (CMP). To secure bonding strength, the planarization should form the bonding surface as an entirely flat surface. However, since the chip region and the scribe lane region have different surface characteristics, a step between the chip region and the scribe region may be formed during planarization.

SUMMARY

According to exemplary embodiments of the inventive concept, there is provided a method for wafer planarization including forming a second insulating layer and a polishing layer on a substrate having a chip region and a scribe lane region; forming a first through-hole in the polishing layer in the chip region and the scribe lane region and a second through-hole in the second insulating layer in the chip region, wherein the second through-hole and the first through-hole meet in the chip region; forming a pad metal layer inside the first through-hole and the second through-hole and on an upper surface of the polishing layer; and polishing the polishing layer and the pad metal layer by a chemical mechanical polishing (CMP) process to expose an upper surface of the second insulating layer in the chip region and the scribe lane region.

According to exemplary embodiments of the inventive concept, there is provided a method ter wafer planarization including forming an insulating layer and a polishing layer on a substrate having a chip region and a scribe lane region; forming a first through-bole in the polishing, layer in the chip region and the scribe lane region using a first photoresist pattern formed on an upper surface of the polishing layer as an etch mask and forming a second through-hole connected to the first through-hole in the insulating layer in the chip region; forming a pad metal layer in interiors of the first through-hole and the second through-hole and on an upper surface of the polishing layer; and polishing the polishing layer and the pad metal layer by a CMP process to expose an upper surface of the insulating layer in the chip region and the scribe lane region, wherein the first through-hole formed in the scribe lane region is formed with a horizontal cross-sectional area that is smaller than that of the first through-hole formed in the chip region.

According to exemplary embodiments of the inventive concept, there is provided an image sensor including a lower substrate comprising a lower main substrate having a chip region and a scribe lane region and a lower line layer disposed on the lower main substrate; and an upper substrate comprising an upper main substrate having a chip region and a scribe lane region and an upper line layer disposed on the upper main substrate, wherein the upper substrate is disposed on the lower substrate, wherein the lower line layer has a lower insulating layer disposed at an uppermost portion of the lower substrate, the upper line layer has an upper insulating layer disposed at a lowermost portion of the upper substrate, an upper surface of the lower insulating layer and a lower surface of the upper insulating layer are bonded to each other, the lower insulating layer has a lower insulating recess in an upper surface of the scribe lane region of the lower substrate, and the upper insulating layer has an upper insulating recess in a lower surface of the scribe lane region of the upper substrate.

According to an exemplary embodiment of the inventive concept, there is provided a method for wafer planarization including: forming a substrate including a chip region and a scribe lane region; firming an insulating layer on the substrate; forming a polishing layer on the insulating layer; forming a first through-hole in the polishing layer in the scribe lane region; forming a second through-hole in the insulating layer in the chip region; forming a pad metal layer in the first and second through-holes and on the polishing layer; and polishing the pad metal layer to expose a surface of the insulating layer in the chip region and the scribe lane region.

DETAILED DESCRIPTION OF THE EMBODIMENTS

Hereinafter, a method for wafer planarization and an image sensor by the same according to exemplary embodiments of the inventive concept will be described.

A wafer to which a method for wafer planarization according to an exemplary embodiment of the inventive concept is applied will be described.

Figure 1A:
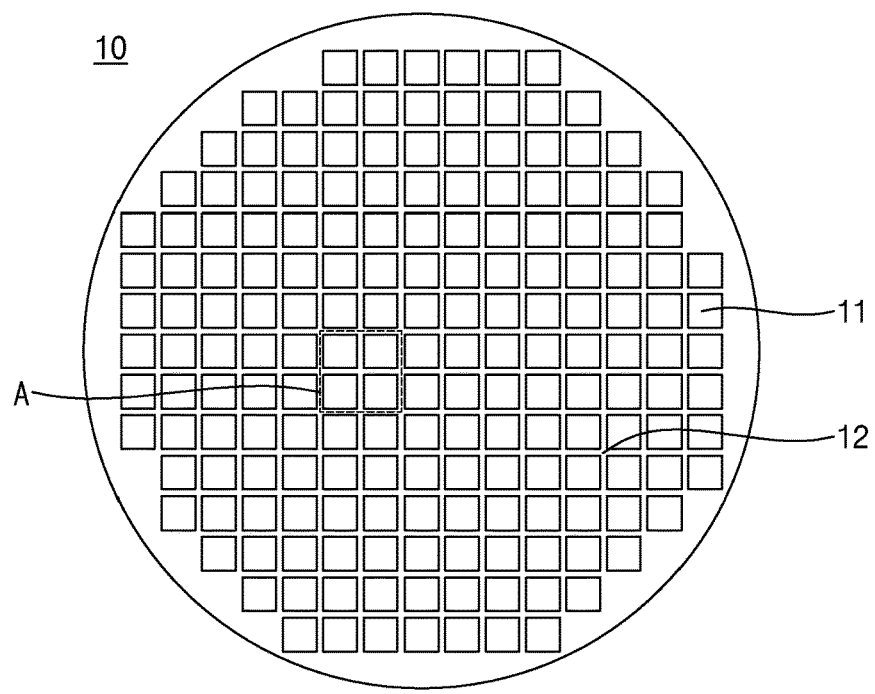
FIG. 1A is a plan view of a wafer.
Figure 1B:
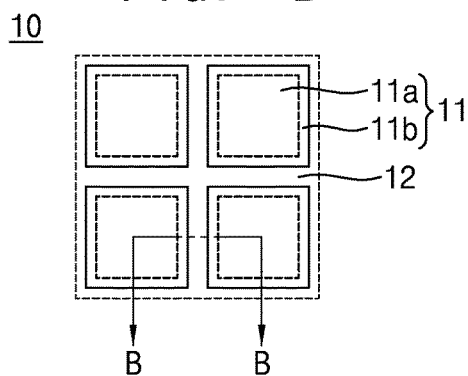
FIG. 1B is a partially enlarged view of portion A of FIG.
Figure 1C:
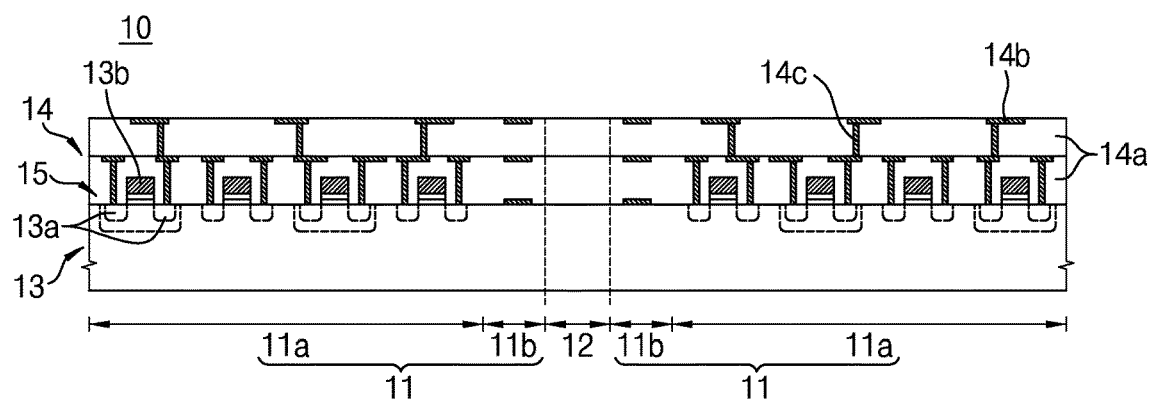
FIG. 1C is a vertical cross-sectional view taken along line B-B of FIG. 1B.

FIG. 1A is a plan view of a wafer, FIG. 1B is a partially enlarged view of portion A of FIG. 1A, and FIG. 1C is a vertical cross-sectional view taken along line B-B of FIG. 1B.

A wafer 10, which will be described below, may be a wafer used for a complementary metal-oxide semiconductor (CMOS) image sensor. The wafer 10 may be a lower substrate 20 or an upper substrate 40 of an image sensor (see FIGS. 3A to 3C). Hereinafter, a case in which the wafer 10 is the lower substrate 20 of the image sensor will be described. In the following description, the wafer 10 may be identically or similarly applied to the upper substrate 40.

Referring to FIGS. 1A to 1C, the wafer 10 includes chip regions 11 and scribe lane regions 12 with respect to a horizontal direction. The chip regions 11 are disposed in a grid form while being spaced apart from one another in a horizontal direction on the wafer 10. The chip region 11 may include a pixel region 11a and a ferry region 11b. The wafer 10 may include a first surface and a second surface. The first surface of the wafer 10 may be an upper surface of the wafer 10. The second surface of the wafer 10 may be a lower surface of the wafer 10.

The wafer 10 may include a substrate main body 13 (also referred to as 'the main substrate') and a line layer 14. In the wafer 10, the line layer 14 may be disposed on the main substrate 13. An upper surface of the line layer 14 may face upward in the wafer 10, and a lower surface of the main substrate 13 may face downward. The wafer 10 may further include transistors 15. The wafer 10 may further include additional components together with the main substrate 13, the line layer 14, and the transistor 15.

The main substrate 13 may include a bulk silicon substrate or a silicon-on-insulator (SOI) substrate. The main substrate 13 may be a first conductive type substrate. The chip region 11 of the main substrate 13 includes a plurality of source/drain regions 13a. The scribe lane region 12 of the main substrate 13 does not include the source/drain regions 13a. The plurality of source/drain regions 13a may form the transistors 15.

The line layer 14 may include a plurality of insulating layers 14a. The chip region H of the line layer 14 may further include a plurality of conductive pads 14b and a plurality of conductive vias 14c. The scribe lane region 12 of the line layer 14 does not include the plurality of conductive pads 14b and the plurality of conductive vias 14c. For example, the scribe lane region 12 may just include the insulating layer 14a and the main substrate 13.

The plurality of insulating layers 14a may be formed on the main substrate 13. The conductive pad 14b may be disposed at an upper side or a lower side of each of the plurality of insulating layers 14a and be exposed to an upper surface or a lower surface of each of the plurality of insulating layers 14a. The plurality of conductive pads 14b may be exposed to an upper surface of the line layer 14. The conductive pad 14b may be exposed to an upper surface of the insulating layer 14a which is located at an uppermost portion of the wafer 10. In this case, an upper surface of the conductive pad 14b may be coplanar with the upper surface of the insulating layer 14a. The insulating layer 14a may be formed of an insulating material such as SiCN, SiN, or SiOCN. The conductive via 14c may vertically pass through the insulating layer 14a. The conductive via 14c may electrically connect the upper and lower conductive pads 14b or may electrically connect the upper or lower conductive pads 14b to the transistor 15.

The transistor 15 may be formed in the main substrate 13 and the insulating layer 14a. The transistor 15 may include the source/drain regions 13a formed in the main substrate 13 and a gate electrode 13b formed in the insulating layer 14a. The source/drain regions 13a may be disposed adjacent to an upper surface of the main substrate 13. The transistor 15 may be a logic transistor. The transistors 15 may be transistors of different conductivity types. For example, the transistors 15 may include n-type transistors and p-type transistors.

Figure 3A:
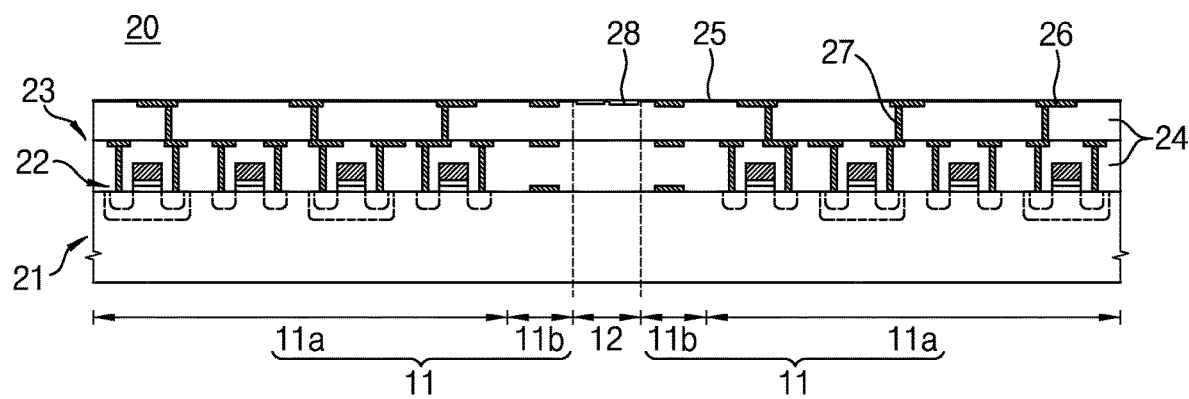
FIGS. 3A and 3B are vertical cross-sectional views of a lower substrate and an upper substrate which are formed by the method for wafer planarization according to an exemplary embodiment of the inventive concept.
Figure 3B:
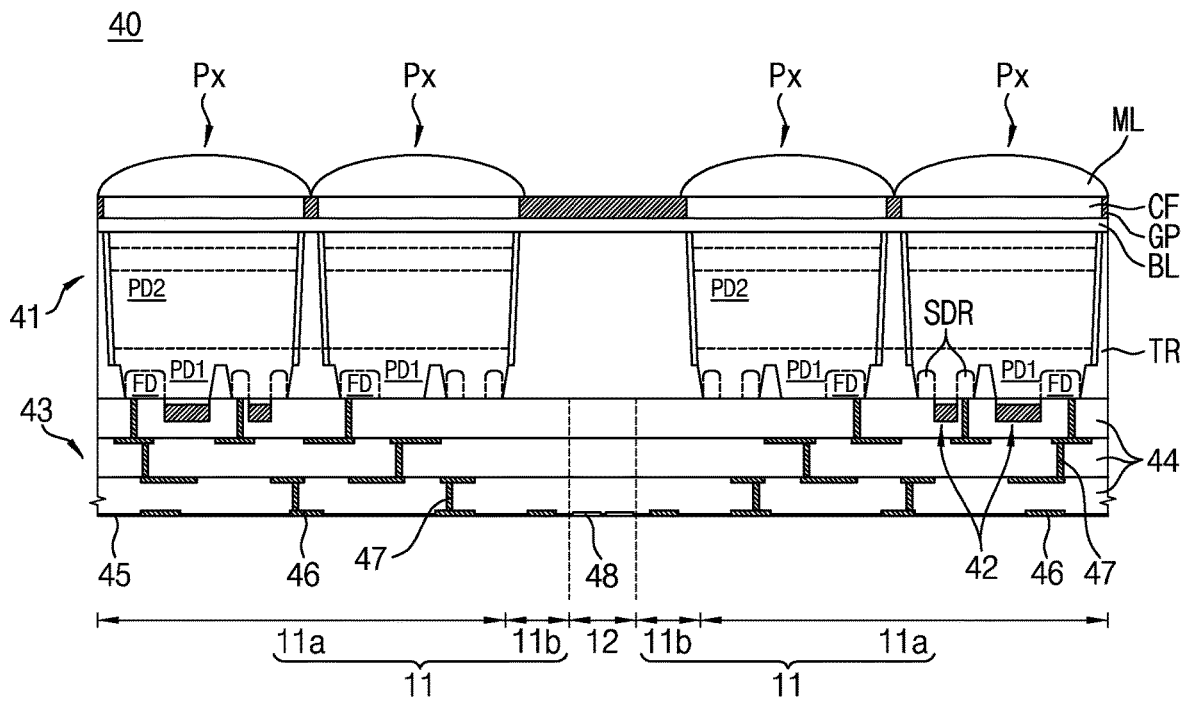
Figure 3C:
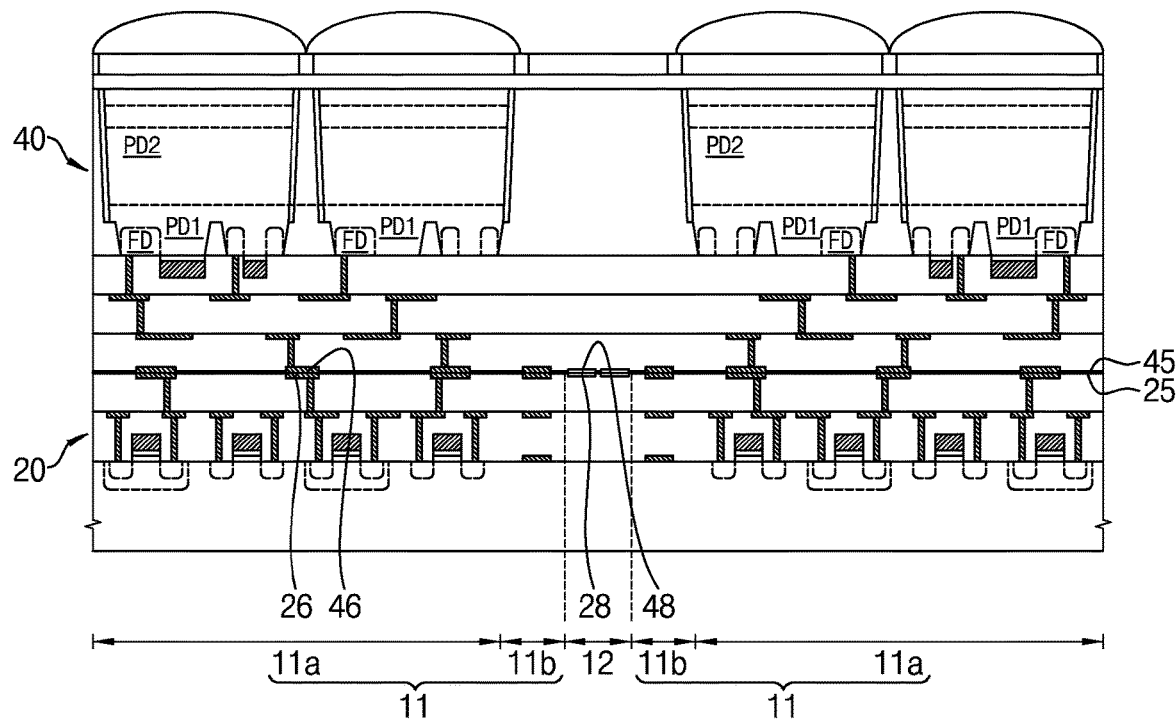
FIG. 3C is a vertical cross-sectional view of an image sensor formed by bonding.

After a chemical mechanical polishing (CMP) process is performed on the wafer 10, the wafer 10 may be wafer-bonded to another wafer 10 that forms the upper substrate 40 and includes the image sensor (see FIGS. 3A to 3C). The wafer bonding is performed such that a line layer of the wafer 10 that forms the lower substrate 20 is in contact with and bonded to a line layer of the wafer 10 that forms the upper substrate 40. In this case, the conductive pad 14b exposed to the upper surface of the line layer 14 of the wafer 10 that forms the lower substrate 20 may be bonded and electrically connected to the conductive pad 14b exposed to a lower surface of the line layer of the wafer 10 that forms the upper substrate 40. It is necessary for the wafer bonding to completely bond the conductive pads 14b formed in the chip regions 11 of the two wafers 10 to prevent generation of a void. In wafer bonding, when a void is formed in the chip region 11, a physical contact and bonding between the conductive pads 14b becomes incomplete such that a wafer bonding characteristic and reliability of the image sensor may be degraded.

In the wafer 10 shown in FIGS. 1A to 1C, the insulating layers 14a located above the chip region 11 and the scribe lane region 12 are simultaneously planarized by CMP to be formed as the bonding surface. The bonding surface includes an upper surface of the insulating layer 14a located at an uppermost portion of the chip region 11 and an upper surface of the insulating layer 14a located at an uppermost portion of the scribe lane region 12. Since the conductive pad 14b is exposed at the upper surface of the insulating layer 14a of the chip region 11, a degree of polishing may be different from that of the insulating layer 14a of the scribe lane region 12 which does not include the conductive pad 14b exposed at its upper surface. Therefore, a CMP planarization process may be employed to prevent a step between the bonding surfaces of the chip region 11 and the scribe lane region 12.

A method for wafer planarization according to an exemplary embodiment of the inventive concept will be described below.

FIGS. 2A to 2H are vertical cross-sectional views illustrating a process of a method for wafer planarization according to an exemplary embodiment of the inventive concept.

The method for wafer planarization according to the present embodiment is a method of planarizing the bonding surface of the wafer 10 so as to bond the wafer 10. Hereinafter, the method for wafer planarization will be mainly described with respect to a process of forming the insulating layer 14a located at an uppermost portion of the wafer 10 and the conductive pad 14b located on the insulating layer 14a of the chip region 11. The method of wafer planarization will be illustrated and described with respect to the insulating layer 14a which is located at the uppermost portion of the wafer 10 and from which the conductive pad 14b is exposed. The main substrate 13 and an additional insulating layer 14a formed on the main substrate 13 may not be illustrated and thus descriptions thereof will be omitted. The method of wafer planarization hereinafter described prevents generation of a step or flection between the bonding surfaces of the chip region 11 and the scribe lane region 12.

Figure 2A:
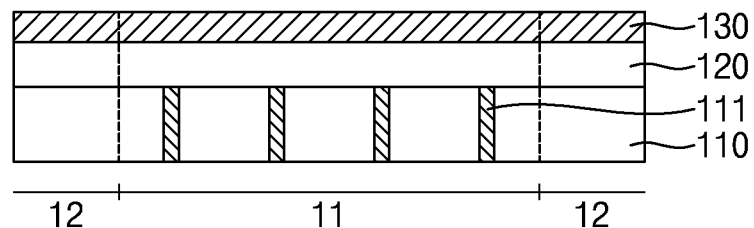
FIGS. 2A, 2B, 2C, 2D, 2E, 2F, 2G and 2H are vertical cross-sectional views illustrating a process of a method for wafer planarization according to an exemplary embodiment of the inventive concept.

Referring to FIG. 2A, a second insulating layer 120 and a polishing layer 130 are formed on an upper surface of a first insulating layer 110. The first insulating layer 110 and the second insulating layer 120 are formed in both of the chip region 11 and the scribe lane region 12. The first insulating layer 110 may be formed by being deposited on an upper surface of an insulating layer located on an upper surface or a lower portion of a main substrate. A conductive via 111 is formed in the first insulating layer 110. The second insulating layer 120 is formed by being deposited on the upper surface of the first insulating layer 110. The second insulating layer 120 may be formed of an insulating material such as SiCN, SiN, or SiOCN. The second insulating layer 120 may be formed to a height depending on a height of a conductive pad 180. The second insulating layer 120 may be formed by a process such as a sputtering process.

The polishing layer 130 is formed with a predetermined thickness on an upper surface of the second insulating layer 120. Since the polishing layer 130 will be polished by CMP, the polishing layer 130 may be formed to have a suitable thickness in consideration of the efficiency of the CMP. The polishing layer 130 may be formed to have a thickness that is smaller than that of the second insulating layer 120. The polishing layer 130 may be formed of a dielectric such as tetraethoxysilane (TEOS), $SiO_2$, SiCN, SiN, or SiOCN. The polishing layer 130 may be formed of a nonmetallic material such as TaN. The polishing layer 130 may be formed of a material such as siloxane spin-on-glass (SOG), silicate SOG, phosphosilicate glass (PSG), plasma enhanced oxide (PEOX), or undoped silicate glass (USG).

Figure 2B:
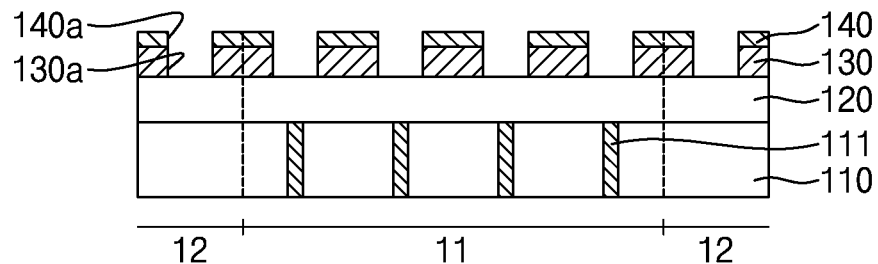

Referring to FIG. 2B, a first through-hole 130a is formed in the polishing layer 130 using a first photoresist pattern 140 formed on an upper surface of the polishing layer 130 as an etch mask. The first photoresist pattern 140 may be formed by applying a photoresist layer onto the upper surface of the polishing layer 130 and then exposing and developing the photoresist layer using a photomask. An antireflective layer for a photoresist process may be formed below the first photoresist pattern 140. A hard mask pattern may be formed instead of the first photoresist pattern 140. The first photoresist pattern 140 may include a first opening 140a corresponding to the first through-hole 130a formed in the polishing layer 130. The first through-hole 130a is formed to pass through the upper surface of the polishing layer 130 to a lower surface of the polishing layer 130. The first through-hole 130a may expose an upper surface of the second insulating layer 120. The first through-hole 130a may be formed to further extend from the upper surface of the polishing layer 130 to a lower portion of the first insulating layer 110 with a predetermined depth The first through-hole 130a may be formed to accommodate a conductive pad 180 (see FIG. 2H) formed in the second insulating layer 120 of the chip region 11. For example, the first through-hole 130a may have a top view with a circular shape. The first through-holes 130a may be formed in the chip region 11 and the scribe lane region 12 with the same size and the same interval. The first through-holes 130a may be formed in the chip region 11 and the scribe lane region 12 with the same hole density. The hole density may refer to an area of the first through-hole 130a per unit area of the bonding surface. For example, the hole density may refer to a hole area per one $cm^2$ of the bonding surface. In accordance with an exemplary embodiment of the inventive concept, the bonding surface of the chip region 11 and the bonding surface of the scribe lane region 12 may be formed in the same state to be identically polished during CMP.

The first through-holes 130a may be formed to have the same top view in the chip region 11 and the scribe lane region 12. For example, all the first through-holes 130a may be formed to have a top view which shows a circular shape. In this case, the first through-holes 130a formed in the chip region 11 and the first through-holes 130a formed in the scribe lane region 12 may have the same diameter. The first through-holes 130a formed in the chip region 11 and the first through-holes 130a formed in the scribe lane region 12 may be formed and spaced apart from each other by the same separation distance.

The first through-holes 130a may be formed to have different top views in the chip region 11 and the scribe lane region 12. For example, the first through-holes 130a formed in the chip region 11 may have a shape corresponding to a shape of the conductive pad 180, and the first through-holes 130a formed in the scribe lane region 12 may have an elliptical shape, a quadrangular shape, or a cross shape. However, even in such a case, the first through-holes 130a may be formed with the same hole density in the chip region 11 and the scribe lane region 12.

The first through-holes 130a may be formed in different shapes of horizontal cross-sectional areas in the chip region 11 and the scribe lane region 12. However, even in such a case, the first through-holes 130a may be formed with the same hole density in the chip region 11 and the scribe lane region 12.

Figure 2C:
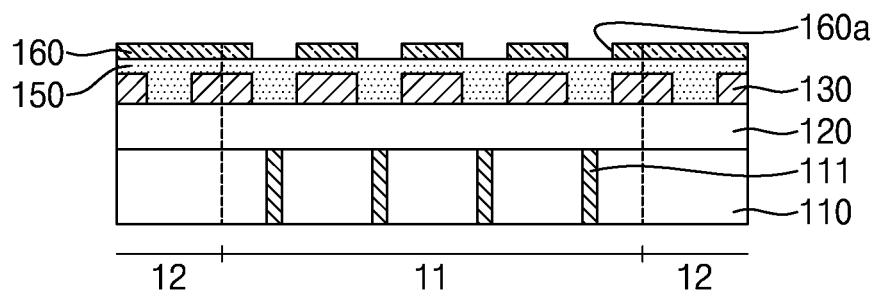

Referring to FIG. 2C, a sacrificial layer 150 is deposited on the upper surface of the polishing layer 130 and an interior of the first through-hole 130a, and a second photoresist pattern 160 is formed on an upper surface of the sacrificial layer 150. The first photoresist pattern 140 is removed before the sacrificial layer 150 is deposited. The first photoresist pattern 140 may be removed by an asking strip process, A hard mask pattern may be formed instead of the first photoresist pattern 140. In this case, the hard mask pattern may not be removed before the sacrificial layer 150 is deposited.

The sacrificial layer 150 is formed in an entirety of the chip region 11 and the scribe lane region 12. The sacrificial layer 150 may cover the upper surface of the polishing layer 130 and fill the interiors of the first through-holes 130a in the chip region 11 and the scribe lane region 12. The sacrificial layer 150 may be formed of a material having an etch selectivity with respect to the polishing layer 130. The sacrificial layer 150 may be formed of a material having no etch selectivity with respect to the second insulating layer 120. The sacrificial layer 150 may be formed of a dielectric such as TEOS, $SiO_2$, SiCN, SiN, or SiOCN. The sacrificial layer 150 may be formed of a non-metallic material such as TaN. The sacrificial layer 150 may be formed of a material such as siloxane SOG, silicate SOG, PSG, PEOX, or USG. The sacrificial layer 150 may be formed of an organic material or an inorganic material. The sacrificial layer 150 may be formed of a polyarylene ether-based material, a polymeta methylacrylate-based material, or a spin-on-polymer (SOP) such as a vinylether metacrylate-based material. The sacrificial layer 150 may be formed of an inorganic material such as a hydrogen silsesquioxane (HSQ)-based material or a methylsilsesquioxane (MSQ) based material.

The second photoresist pattern 160 may be formed by applying a photoresist layer onto the upper surface of the sacrificial layer 150 and then exposing and developing the photoresist layer using a photomask. The second photoresist pattern 160 may include a second opening 160*a* formed at a position corresponding to the first through-hole 130*a* formed in the polishing layer 130 of the chip region 11. The second opening 160*a* may be formed to have a top view that is identical to that of the first opening 140*a*. The second opening 160*a* may be formed only in a region corresponding to the chip region 11 in the second photoresist pattern 160.

Figure 2D:
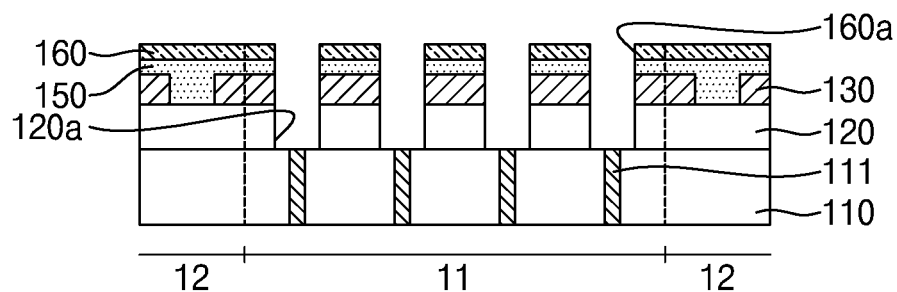

Referring to FIG. 2D, a second through-hole 120*a* is formed in the sacrificial layer 150, the polishing layer 130, and the second insulating layer 120 of the chip region 11 using the second photoresist pattern 160 as an etch mask. The second through-hole 120*a* may have a top view that is identical to that of the first through-hole 130*a* formed in the chip region 11, The top view of the second through-hole 120*a* may be identical to the shape and size of the first through-hole 130*a*. For example, the second through-hole 120*a* may have a top view which has a circular shape having a diameter that is identical to a diameter of the first through-hole 130*a*. The second through-hole 120*a* may have a top view corresponding to the conductive pad 180. The second through-hole 120*a* is formed at the same position as the first through hole 130*a* in the chip region 11 with respect to a horizontal surface of the polishing layer 130. The second through-hole 120*a* may include the first through-hole 130*a* formed in the polishing layer 130. The second through-hole 120*a* may expose the upper surface of the first insulating layer 110 and an upper surface of the conductive via 111 by passing through the second insulating layer 120.

Figure 2E:
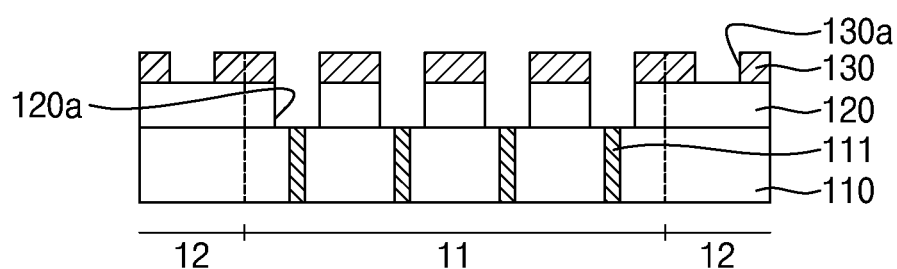

Referring to FIG. 2E, the second photoresist pattern 160 and the sacrificial layer 150 are removed to expose the first through-hole 130*a* of the scribe lane region 12. The second through-hole 120*a* passing through the polishing layer 130 and the second insulating layer 120 is formed in the chip region 11, and the first through-hole 130*a* passing through the polishing layer 130 is formed in the scribe lane region 12. The second through-hole 120*a* may expose the upper surface of the first insulating layer 110 and the upper surface of the conductive via 111.

Figure 2F:
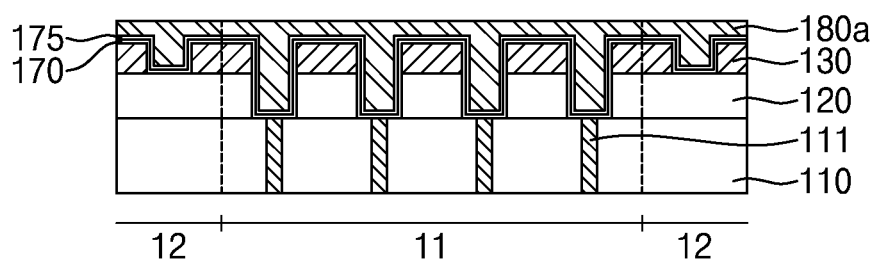

Referring to FIG. 2F, a diffusion prevention layer 170, a pad seed layer 175, and a pad metal layer 180*a* are formed in a region including interiors of the first through-hole 130*a* and the second through-hole 120*a* and the upper surface of the polishing layer 130, The diffusion prevention layer 170 is formed in a region including the upper surface of the conductive via 111 exposed by the second through hole 120*a*, an inner surface of the second through-hole 120*a*, and the upper surface of the polishing layer 130 in the chip region 11. The diffusion prevention layer 170 is formed in a region of the scribe lane region 12 including the upper surface of the second insulating layer 120, which is exposed by the first through-hole 130*a*, the inner surface of the first through hole 130*a*, and the upper surface of the polishing layer 130, which is exposed by the first through-hole 130*a*. The pad seed layer 175 may be deposited on a surface of the diffusion prevention layer 170. The pad metal layer 180*a* is formed on a surface of the pad seed layer 175 to fill the first through-hole 130*a* and the second through-hole 120*a*. The pad metal layer 180*a* may also be formed on the upper surface of the polishing layer 130.

The diffusion prevention layer 170 may be formed of a material such as titanium, titanium nitride, tungsten, tungsten nitride, a titanium tungsten alloy, chromium, chromium nitride, tantalum, or tantalum nitride. The diffusion prevention layer 170 may be formed with a thickness of 30 Å to 300 Å. The diffusion prevention layer 170 may be formed by a process such as a chemical vapor deposition (CVD) process, a sputtering process, or an atomic layer deposition process. The diffusion prevention layer 170 prevents diffusion of a copper material of the pad metal layer 180*a* to its surroundings. The pad seed layer 175 may be formed of a copper material. The pad seed layer 175 is formed by being deposited on a surface of the diffusion prevention layer 170. The pad seed layer 175 may be formed by a CVD process or an electroless plating process. The pad seed layer 175 may be formed with a thickness of 100 Å to 300 Å.

The pad metal layer 180*a* may be formed of a copper material. The pad metal layer 180*a* is formed such that the copper material fills the first through-hole 130*a* and the second through-hole 120*a* and is plated on the surface of the polishing layer 130. The pad metal layer 180*a* is formed on the inner sides of the first through-hole 130*a* and the second through-hole 120*a* and is formed on the upper surface of the polishing layer 130 in the chip region 11 and the scribe lane region 12. The pad metal layer 180*a* is formed with the same pattern density in the chip region 11 and the scribe lane region 12. The pattern density may be similar to that of the hole density described above. The pad metal layer 180*a* may be formed with the same horizontal area per unit horizontal area in the chip region 11 and the scribe lane region 12 with respect to the upper surface of the polishing layer 130. The pad metal layer 180*a* may be formed by an electroplating process.

Figure 2G:
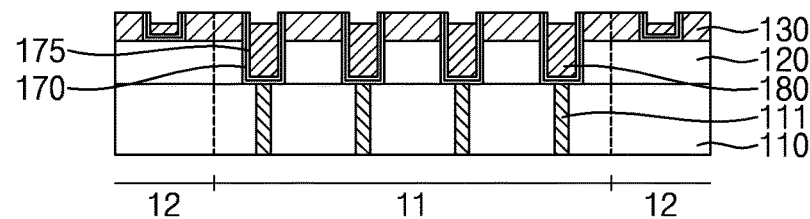

Referring to FIG. 2G, the pad metal layer 180*a* may be polished and removed by a CMP process in the chip region 11 and the scribe lane region 12. The pad metal layer 180*a* formed on the upper surface of the polishing layer 130 is selectively removed by the CMP process. In this case, a portion of the pad metal layer 180*a* formed on the polishing layer 130 and a portion of the pad metal layer 180*a* formed on the first through-hole 130*a* and the second through-hole 120*a* are removed. A portion of the pad metal layer 180*a* may remain in the interiors of the first through-hole 130*a* and the second through-hole 120*a*. The diffusion prevention layer 170 and the pad seed layer 175 in the interiors of the first through-hole 130*a* and the second through-hole 120*a* are also not removed. A polishing slurry used in the CMP process may be a slurry which polishes the pad metal layer 180*a* relatively well.

Figure 2H:
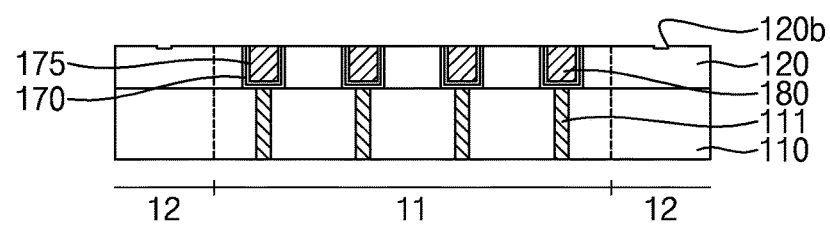

Referring to FIG. 2H, by an additional CMP process, the pad metal layer 180*a* located inside the first through-hole 130*a* and the second through-hole 120*a* is polished to have a height that entirely exposes the upper surface of the second insulating layer 120 and then is removed together with the polishing layer 130. The upper surface of the second insulating layer 120 is exposed in the chip region 11 and the scribe lane region 12 to form a bonding surface. The pad metal layer 180*a* located inside the first through-hole 130*a* is formed at the upper surface of the second insulating layer 120 so that the pad metal layer 180*a* may be entirely removed from the first through-hole 130*a*. The pad metal layer 180*a* located inside the second through-hole 120*a* is formed at the lower portion of the second insulating layer 120 so that the pad metal layer 180*a* may be removed only up to a height corresponding to the upper surface of the second insulating layer 120. The slurry used in the CMP process may be an alkaline colloidal silica slurry of which a selectivity ratio to a metal is in the range of 1:1.4 to 1:1.8 and a particle size of an abrasive is 50 nm.

The chip region 11 and the scribe lane region 12 have the same or similar internal structure from the upper surface of the polishing layer 130 to a predetermined depth or a lower surface of the polishing layer 130. The chip region 11 and the scribe lane region 12 also have the same or similar internal structure from the upper surface of the polishing layer 130 to the upper surface of the second insulating layer 120 located on the lower surface of the polishing layer 130. The polishing layer 130 is to be polished at the same speed in the chip region 11 and the scribe lane region 12. To accomplish this, the polishing layer 130 is formed with the same layer structure or pattern in the chip region 11 and the scribe lane region 12. For example, the pad metal layer 180a may be formed in the polishing layer 130 with the same pattern density in the chip region 11 and the scribe lane region 12. When the polishing layer 130 is polished by a CMP process, the polishing layer 130 is polished and removed at the same speed or to the same height in the chip region 11 and the scribe lane region 12. Since the second insulating layer 120, which is exposed after the polishing layer 130 is polished, is polished until its upper surface is entirely exposed, the second insulating layer 120 may be polished to have the same height in the chip region 11 and the scribe lane region 12 even though the chip region 11 and the scribe lane region 12 are in different states. Consequently, a step is not formed on the bonding surfaces of the chip region 11 and the scribe lane region 12. After the CMP process, the conductive pad 180 is formed in the second through-hole 120a.

In the second insulating layer 120, a second insulating recess 120b may be formed in the upper surface of the scribe lane region 12 after the CMP process. The second insulating recess 120b may be tanned at a position corresponding to the first through-hole 130a. As shown in FIGS. 2G and 2H, the second insulating recess 120b may be formed in the upper surface of the second insulating layer 120 while the CMP process proceeds in two stages. As described above, the second insulating recess 120b may be formed when the polishing slurry used in the CMP process of FIG. 2H is a slurry of which a selectivity ratio to a metal is in the range of 1:1.4 to 1:1.8. During the CMP process, in the scribe lane region 12, the pad metal layer 180a is polished and thus the diffusion prevention layer 170 and the polishing layer 130 are exposed. Since the diffusion prevention layer 170 is polished relatively faster than the polishing layer 130 or is removed during the polishing process, the surface of the second insulating layer 120 is exposed first. Consequently, in a subsequent CMP process, the polishing layer 130 and the second insulating layer 120 are polished together, and the second insulating recess 120b may be formed at a position of the pad metal layer 180a on the upper surface of the second insulating layer 120 of the scribe lane region 12. The second insulating recess 120b may have a shape corresponding to a top view of the diffusion prevention layer 170 formed on a lower surface of the first through-hole 130a. Since the scribe lane region 12 is not bonded during wafer bonding, the second insulating recess 120b does not affect a bonding characteristic of the chip region 11. Since the second insulating recess 120b is formed while the scribe lane region 12 becomes entirely flat, the second insulating recess 120b is not formed to be entirely concave in the chip region 11.

An oxide layer may be further formed on the upper surface of the second insulating layer 120. The oxide layer may be formed by oxidizing the second insulating layer 120. The oxide layer may be formed by oxidizing the upper surface of the second insulating layer 120 during a CMP process of the second insulating layer 120.

A bonding process of the wafer made by the method for wafer planarization according to an exemplary embodiment of the inventive concept and an image sensor made by the same will be described below.

FIGS. 3A and 3B are vertical cross-sectional views of a lower substrate and an upper substrate which are formed of the wafer made by the method for wafer planarization according to an exemplary embodiment of the inventive concept, and FIG. 3C is a vertical cross-sectional view of an image sensor formed by bonding.

Referring to FIGS. 3A to 3C, the lower substrate 20 and the upper substrate 40 which are formed of the wafer made by the method for wafer planarization according to the exemplary embodiment of the inventive concept may be combined by wafer-to-wafer bonding. An upper surface of the lower substrate 20 and a lower surface of the upper substrate 40 are planarized by the method firm wafer planarization of the inventive concept. Each of the lower substrate 20 and the upper substrate 40 is divided into the chip region 11 and the scribe lane region 12. Each of the lower substrate 20 and the upper substrate 40 may be formed in various internal structures. Accordingly the lower substrate 20 and the upper substrate 40 shown in FIGS. 3A to 3C are example structures.

Referring to FIG. 3A, the lower substrate 20 may include the chip region 11 and the scribe lane region 12. The chip region 11 may include the pixel region 11a and the ferry region 11b.

The lower substrate 20 may include a lower main substrate 21 and a lower line layer 23. In the lower substrate 20, the lower line layer 23 may be disposed above the lower main substrate 21. In the lower substrate 20, an upper surface of the line layer 23 may face upward, and a lower surface of the main substrate 21 may face downward. The lower main substrate 21 and the lower line layer 23 are components corresponding to the main substrate 13 and the line layer 14 of FIG. 1C.

The lower main substrate 21 may include a bulk silicon substrate or an SOI substrate. The lower main substrate 21 may be a first conductive type substrate. The chip region 11 of the lower main substrate 21 includes a plurality of lower transistors 22. The scribe lane region 12 of the lower main substrate 21 does not include the lower transistors 22. The lower transistors 22 may be logic transistors. The lower transistors 22 may be transistors of different conductivity types. For example, the lower transistors 22 may include n-type transistors and p-type transistors.

The lower line layer 23 may include a plurality of insulating layers 24 (also referred to as 'lower insluting layers 24'). The lower line layer 23 may include a lower oxide layer 25. The chip region 11 of the lower line layer 23 may further include a plurality of lower conductive pads 26 and a plurality of lower conductive vias 27. The scribe lane region 12 of the lower line layer 23 does not include the plurality of lower conductive pads 26 and the plurality of lower conductive vias 27. The scribe lane region 12 of the lower line layer 23 may further include a lower insulating recess 28. The lower insulating layer 24, the lower conductive pad 26, and the lower conductive via 27 are components corresponding to the insulating layer 14a, the conductive pad 14b, and the conductive via 14c of FIG. 1C.

A plurality of the lower insulating layers 24 may be formed on the lower main substrate 21 with a predetermined thickness. The lower conductive pad 26 may be disposed at an upper side or a lower side of the lower insulating layer 24 to be exposed to an upper surface or a lower surface of the lower insulating layer 24. A plurality of the lower conductive pads 26 are exposed at an upper surface of the lower line layer 23. The lower conductive pads 26 are also exposed at an upper surface of the lower insulating layer 24 which is located at an uppermost portion of the lower substrate 20. In this case, an upper surface of the lower conductive pad 26 may be coplanar with the upper surface of the lower insulating layer 24. The upper surface of the lower conductive pad 26 may be coplanar with an upper surface of the lower oxide layer 25 located on the lower insulating layer 24. The lower insulating layer 24 may be formed of an insulating material such as SiCN, SiN, or SiOCN.

The lower conductive via 27 is formed to vertically pass through the lower insulating layer 24. The lower conductive via 27 may electrically connect the lower conductive pads 26 located at an upper portion and a lower portion of the lower insulating layer 24, or the lower conductive via 27 may electrically connect the lower conductive pad 26 to the lower transistor 22.

The lower oxide layer 25 may be formed on the upper surface of the lower insulating layer 24 located at the uppermost portion of the lower substrate 20. The lower oxide layer 25 may be formed by oxidizing the lower insulating layer 24. The lower oxide layer 25 may be formed by oxidizing the lower insulating layer 24 during a CMP process of the lower insulating layer 24.

The lower insulating recess 28 is formed on the upper surface of the lower insulating layer 24 located at an upper portion in the scribe lane region 12 of the lower line layer 23. The lower insulating recess 28 may not be formed in the chip region 11. For example, the lower insulating recess 28 may only be formed in the scribe lane region 12. The lower insulating recess 28 may be formed to have a recessed shape from the upper surface of the lower insulating layer 24 in a downward direction towards the main substrate 21. The lower insulating recess 28 may be formed such that an upper portion thereof is open and a shape of a vertical cross section thereof is an arc shape or a rectangular shape. The lower insulating recess 28 may have a polyhedral shape such as a hemispherical shape or a hexahedral shape. Alternatively, since the lower insulating recess 28 is formed by etching the lower insulating layer 24, the upper portion of the lower insulating recess 28 may be open and the vertical cross section thereof may have an irregular shape instead of an arc shape or a rectangular shape.

The lower insulating recess 28 may be formed with the same area density as that of the lower conductive pad 26 exposed to the upper portion of the lower insulating layer 24 in the chip region 11. Here, the area density may be an area of the lower insulating recess 28 per unit area. For example, the area density may be an area of the lower insulating recess 28 or an area of the lower conductive pad 26 per one $cm^2$ of the lower insulating layer 24. Since the lower insulating recess 28 is formed by the CMP process of the lower insulating layer 24, the lower insulating recess 28 may be formed with an area density that is less than that of the lower conductive pad 26. An area of the lower insulating recess 28 may decrease as the lower insulating layer 24 is polished.

Referring to FIG. 3B, like the lower substrate 20, the upper substrate 40 may include the chip region 11 and the scribe lane region 12. The chip region 11 may include the pixel region 11a and the ferry region 11b. The upper substrate 40 may include a plurality of pixels Px in the chip region 11.

The upper substrate 40 may include an upper main substrate 41 and an upper line layer 43. In the upper substrate 40, the upper line layer 43 may be disposed below the upper main substrate 41. In the upper substrate 40, a lower surface of the upper line layer 43 may face downward, and an upper surface of the upper main substrate 41 may face upward. In the upper substrate 40, a buffer layer BL, a color filter CF, a grid pattern GP, and a microlens ML may be disposed on the upper main substrate 41. The color filter CF and the microlens ML of the upper substrate 40 may form the pixel Px.

The upper main substrate 41 may include a bulk silicon substrate or an SOI substrate. The upper main substrate 41 may have the same conductive type as that of the lower main substrate 21. The chip region 11 of the upper main substrate 41 includes a plurality of upper transistors 42. The upper transistors 42 may be image transistors. The scribe lane region 12 of the upper main substrate 41 does not include the upper transistors 42. A plurality of device isolation patterns TR and a plurality of photoelectric conversion regions PD1 and PD2 may be provided inside the upper main substrate 41. The device isolation pattern TR may include an insulating material. The device isolation pattern TR may include a material having a refractive index that is lower than that of the upper main substrate 41. The photoelectric conversion regions PD1 and PD2 may be regions doped with a first conductive type impurity or a second conductive type impurity. The upper main substrate 41 may include a floating diffusion region FD and source/drain regions SDR. The floating diffusion region FD and the source/drain regions SDR may be regions doped with a first conductive type impurity or a second conductive type impurity.

The upper line layer 43 may include a plurality of upper insulating layers 44. The upper line layer 43 may include an upper oxide layer 45. The chip region 11 of the upper line layer 43 may further include a plurality of upper conductive pads 46 and a plurality of upper conductive vias 47. The scribe lane region 12 of the upper line layer 43 may not include the plurality of upper conductive pads 46 and the plurality of upper conductive vias 47. The scribe lane region 12 of the upper line layer 43 may further include an upper insulating recess 48.

A plurality of the upper insulating layers 44 may be formed below the upper main substrate 41 with a predetermined thickness. The upper conductive pad 46 may be disposed at an upper side or a lower side of the upper insulating layer 44 to be exposed to an upper surface or a lower surface of the upper insulating layer 44. A plurality of the upper conductive pads 46 may be exposed on a lower surface of the upper line layer 43. The upper conductive pads 46 exposed at a lower surface of the upper insulating layer 44 may be provided at a lowermost portion of the upper insulating layer 44. In this case, a lower surface of the upper conductive pad 46 may be coplanar with the lower surface of the upper insulating layer 44. The lower surface of the upper conductive pad 46 may be coplanar with a lower surface of the upper oxide layer 45 located at the lower portion of the upper insulating layer 44. The upper insulating layer 44 may be formed of an insulating material such as SiCN, SiN, or SiOCN.

The upper oxide layer 45 may be formed on the lower surface of the upper insulating layer 44 located at the lowermost portion of the upper substrate 40. The upper oxide layer 45 may be formed by oxidizing the upper insulating layer 44. The upper oxide layer 45 may be formed by oxidizing the upper insulating layer 44 during a CMP process of the upper insulating layer 44.

The upper conductive via 47 is formed to vertically pass through the upper insulating layer 44. The upper conductive via 47 may electrically connect the upper conductive pads 46 located at an upper portion and a lower portion of the upper insulating layer 44, or the upper conductive via 47 may electrically connect the upper conductive pad 46 located at the upper portion of the upper insulating layer 44 to the upper transistor 42.

The upper insulating recess 48 is formed on a lower surface of the upper insulating layer 44 located at a lower portion in the scribe lane region 12 of the upper line layer 43. For example, the upper insulating recess 48 may be formed at a lowermost portion of the upper substrate 40. The upper insulating recess 48 may not be formed in the chip region 11. For example, the upper insulating recess 48 may only be formed in the scribe lane region 12. The upper insulating recess 48 may be formed in the same shape as that of the lower insulating recess 28 with respect to the horizontal direction. The upper insulating recess 48 may be formed at a position the same as that of the lower insulating recess 28. When the upper substrate 40 and the lower substrate 20 are wafer-bonded, the upper insulating recess 48 may be located above the lower insulating recess 28. In this case, the upper insulating recess 48 and the lower insulating recess 28 may form a void together. The upper insulating recess 48 may be formed at a position different from that of the lower insulating recess 28 with respect to the horizontal direction. The upper insulating recess 48 may be formed with an area density that is less than or equal to that of the upper conductive pad 46 exposed to the lower portion of the upper insulating layer 44 in the chip region 11. The upper insulating recess 48 may be formed with a density that is equal to that of the lower insulating recess 28.

Referring to FIG. 3C, the lower insulating layer 24 of the lower substrate 20 and the upper insulating layer 44 of the upper substrate 40 are bonded to be in contact with each other. In this case, when the lower oxide layer 25 is formed on the upper surface of the lower insulating layer 24 and the upper oxide layer 45 is formed on the lower surface of the upper insulating layer 44, the lower oxide layer 25 and the upper oxide layer 45 are in contact with and bonded to each other. The upper conductive pad 46 located in the chip region 11 of the upper substrate 40 is in contact with and bonded to the lower conductive pad 26 located in the chip region 11 of the lower substrate 20. Since the insulating layer of the chip region 11 is planarized without a step with the insulating layer of the scribe lane region 12, the upper substrate 40 and the lower substrate 20 are in uniform contact with each other such that a void is not formed. The upper insulating recess 48 located in the scribe lane region 12 of the upper substrate 40 may form an empty space with the lower insulating recess 28 located in the scribe lane region 12 of the lower substrate 20. When the upper substrate 40 and the lower substrate 20 are bonded to each other, the scribe lane region 12 may be cut out and thus image sensors may be formed.

In the method for wafer planarization, an etch stop layer may be formed between the second insulating layer 120 and the polishing layer 130. The etch stop layer may be applied to a method for wafer planarization according to an exemplary embodiment of the inventive concept which will be described below.

A method for wafer planarization according to an exemplary embodiment of the inventive concept will be described below.

Figure 4A:
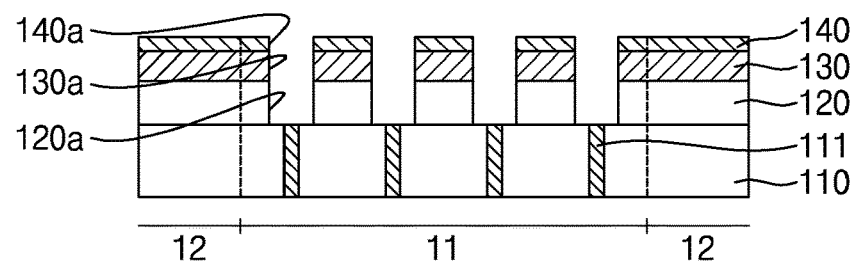
FIGS. 4A and 4B are vertical cross-sectional views illustrating a process of the method for wafer planarization according to an exemplary embodiment of the inventive concept.
Figure 4B:
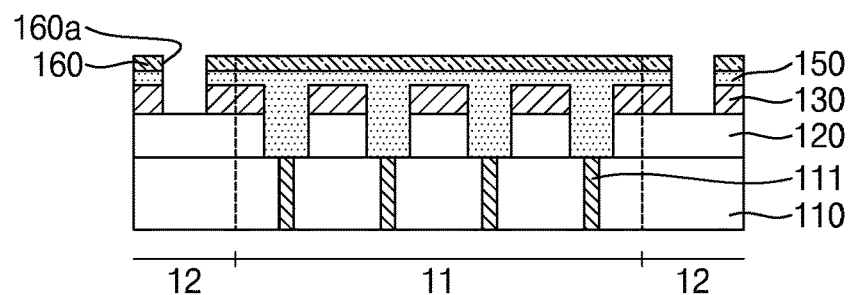

FIGS. 4A and 4B are vertical cross-sectional views illustrating a process of the method for wafer planarization according to an exemplary embodiment of the inventive concept. FIGS. 4A and 4B are vertical cross-sectional views corresponding to FIGS. 2B and 2D.

As compared with the method for wafer planarization according to FIGS. 2A to 2H, the method for wafer planarization according to the present embodiment is different in the order of forming the first through-hole 130a and the second through-hole 120a. According to the current method for wafer planarization, the second through-hole 120a is formed first and then the first through-hole 130a is formed.

Referring to FIG. 4A, the first through-hole 130a is formed in the polishing layer 130 of the chip region 11 and the second through-hole 120a is formed in the second insulating layer 120 using the first photoresist pattern 140 formed on the upper surface of the polishing layer 130 as an etch mask. The first photoresist pattern 140 may include the first opening 140a corresponding to a top view of the first through-hole 130a formed in the polishing layer 130, The first through-hole 130a is formed by, passing through the polishing layer 130 in the chip region 11. The second through-hole 120a is formed by passing through the second insulating layer 120 in the chip region 11. The first through-hole 130a and the second through-hole 120a may be sequentially formed.

Referring to FIG. 4B, the sacrificial layer 150 is deposited on the upper surface of the polishing layer 130 and inside the first through-hole 130a and the second through-hole 120a. The second photoresist pattern 160 is formed on the upper surface of the sacrificial layer 150. The second photoresist pattern 160 is provided with the second opening 160a in the scribe lane region 12. The second opening 160a is formed at a position corresponding to the first through-hole 130a and the second through-hole 120a in the scribe lane region 12.

Subsequently, as shown in FIG. 2E, the second photoresist pattern 160, the sacrificial layer 150, and the polishing layer 130 are removed to expose the first through-hole 130a and the second through-hole 120a in the chip region 11. A subsequent process may proceed according to the processes of FIGS. 2F to 2H.

A method for wafer planarization according to an exemplary embodiment of the inventive concept will be described below.

Figure 5:
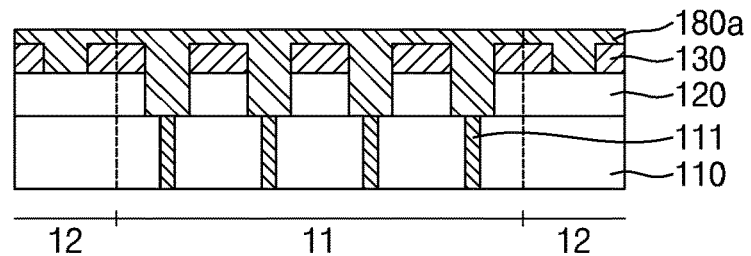
FIG. 5 is a vertical cross-sectional view illustrating a process of the method for wafer planarization according to an exemplary embodiment of the inventive concept.

FIG. 5 is a vertical cross-sectional view illustrating a process of the method for wafer planarization according to an exemplary embodiment of the inventive concept. FIG. 5 is a vertical cross-sectional view corresponding to FIG. 2F.

As compared with the method for wafer planarization according to FIGS. 2A to 2H, the method for wafer planarization according to the present embodiment is different in that the diffusion prevention layer 170 and the pad seed layer 175 are not formed before the pad metal layer 180a. Therefore, the difference in the method for wafer planarization will be mainly described below. A detailed description of a configuration according to the current method for wafer planarization, which is the same as or similar to the method for water planarization of FIGS. 2A to 2H, will be omitted.

In the method for wafer planarization according to the present embodiment, the processes proceed according to FIGS. 2A to 2E. Then, a process according to FIG. 5 proceeds.

Referring to FIG. 5, the pad metal layer 180a is formed inside the first through-hole 130a and the second through-hole 120a. In this embodiment, the diffusion prevention layer 170 and the pad seed layer 175 are not formed inside the first through-hole 130a and the second through-hole 120a. The pad metal layer 180a may be formed of a material such as copper, nickel, or titanium. The pad metal layer 180a may be formed of a metal material which does not diffuse into the first insulating layer 110 during a manufacturing process or use. The pad metal layer 180a may be formed of a copper material so that, even when a metal material is diffused into the second insulating layer 120 during process or use, there are no adverse effects. The pad metal layer 180a may be formed by a method such as an electroplating or CVD process.

Since the diffusion prevention layer 170 is not formed inside the first through-hole 130a in the scribe lane region 12, the second insulating recess 120b shown in FIG. 2H may not be formed during a CMP process.

A method for wafer planarization according to an exemplary embodiment of the inventive concept will be described below.

Figure 6A:
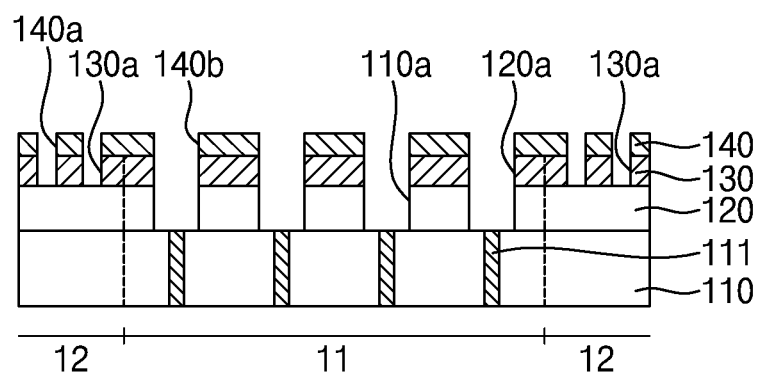
FIGS. 6A and 6B are vertical cross-sectional views illustrating a process of the method for wafer planarization according to an exemplary embodiment of the inventive concept.
Figure 6B:
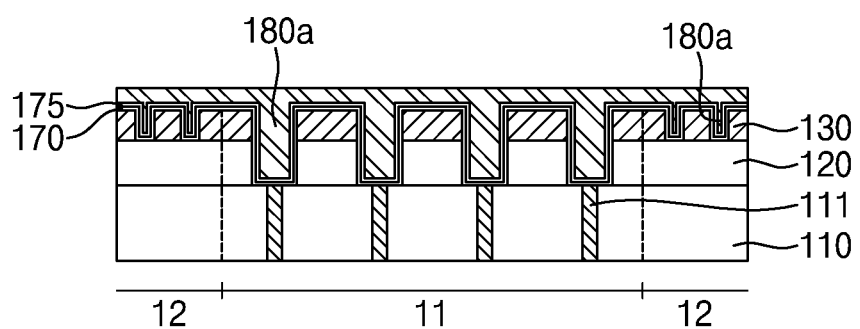

FIGS. 6A and 6B are vertical cross-sectional views illustrating a process of the method for wafer planarization according to an exemplary embodiment of the inventive concept.

As compared with the method for wafer planarization according to FIGS. 2A to 2H, the method for wafer planarization according to the present embodiment is different in that the first through-hole 130a and the second through-hole 120a are formed to have different diameters.

Referring to FIG. 6A, the second insulating layer 120 and the polishing layer 130 are formed on the upper surface of the first insulating layer 110, the first through-hole 130a is formed in the polishing layer 130 using the first photoresist pattern 140 formed on the upper surface of the polishing layer 130 as an etch mask, and the second through-hole 120a is formed in the second insulating layer 120. The first through holes 130a are simultaneously formed in the chip region 11 and the scribe lane region 12 using the first photoresist pattern 140 as an etch mask. The first photoresist pattern 140 is provided with the first opening 140a at a position corresponding to the first through-hole 130a. The second through-hole 120a is formed in the second insulating layer 120 in the chip region 11 and is connected to the first through-hole 130a. Therefore, the first through-hole 130a formed in the polishing layer 130 of the chip region 11 and the scribe lane region 12 and the second through-hole 120a formed in the second insulating layer 120 of the chip region 11 may be sequentially formed during the same process. The first through-hole 130a formed in the scribe lane region 12 is formed to have a horizontal cross-sectional area that is less than that of the first through-hole 130a formed in the chip region 1. The first photoresist pattern 140 is provided with the first opening 140a and a second opening 140b. The first opening 140a is formed in a region corresponding to the first through-hole 130a formed in the scribe lane region 12, and the second opening 140b is formed in a region corresponding to the first through-hole 130a formed in the chip region 11. The first opening 140a has a horizontal cross-sectional area that is less than that of the second opening 140b. For example, the first opening 140a has a diameter or area that is less than that of the second opening 140b. Consequently, the first through-hole 130a thrilled by the first opening 140a has a depth that is relatively shallow compared to a depth of the second through-hole 120a formed by the second opening 140b. The diameters or areas of the first opening 140a and the second opening 140b may be determined in consideration of thicknesses of the polishing layer 130 and the second insulating layer 120.

The first opening 140a and the second opening 140b are formed to have the same hole density. In order to have the same hole density, the number of first openings 140a may increase instead of having a relatively small area. For example, four first openings 140a may be formed, and one second opening 140b may be formed based on the same area.

Referring to FIG. 6B, the diffusion prevention layer 170, the pad seed layer 175, and the pad metal layer 180a are formed in a region including the interiors of the first through-hole 130a and the second through-hole 120a and the upper surface of the polishing layer 130.

The pad metal layer 180a formed in the polishing layer 130 in the scribe lane region 12 has a vertical cross-sectional area that is smaller than that of the pad metal layer 180a formed in the polishing layer 130 of the chip region 11. It is to be understood, however, that the pattern densities of the pad metal layer 180a in the scribe lane region 12 and the chip region 11 may be equal to each other. The pad metal layer 180a formed in the polishing layer 130 in the scribe lane region 12 may have the same entire area as that of the pad metal layer 180a formed in the polishing layer 130 of the chip region 11. Therefore, the scribe lane region 12 and the chip region 11 may be uniformly polished during a CMP process of the polishing layer 130.

According to the exemplary embodiments of the inventive concept, a step between a chip region and a scribe lane region becomes small, and an unbonded region of bonding surfaces in contact with each other during a wafer-to-wafer bonding process becomes small or is non-existent such that a wafer bonding characteristic and reliability of an image sensor can be improved.

While the inventive concept has been particularly shown and described with reference to exemplary embodiments thereof, it should be understood by those skilled in the art that various modifications may be made thereto without departing from the scope of the inventive concept as defined by the following claims.

What is claimed is:

1. A method for wafer planarization, comprising:
   forming a second insulating layer and a polishing layer on a substrate having a chip region and a scribe lane region;
   forming a first through-hole in the polishing layer in the chip region and the scribe lane region and a second through-hole in the second insulating layer in the chip region, wherein the second through-hole and the first through-hole in the chip region meet in the chip region, and the second through-hole has a top view that is identical to that of the first through-hole in the chip region;
   forming a pad metal layer inside the first through-hole in the chip region and the scribe lane region and the second through-hole and on an upper surface of the polishing layer; and
   polishing the polishing layer and the pad metal layer by a chemical mechanical polishing (CMP) process to expose an upper surface of the second insulating layer in the chip region and the scribe lane region such that no pad metal layer remains in the scribe lane region.

2. The method of claim 1, wherein the forming the first through-hole in the chip region and the scribe lane region comprises:

forming the first through-hole in the chip region and the scribe lane region in the polishing layer using a first photoresist pattern formed on the upper surface of the polishing layer as an etch mask;
depositing a sacrificial layer on the upper surface of the polishing layer and inside the first through-hole in the chip region and the scribe lane region and forming a second photoresist pattern on an upper surface of the sacrificial layer;
forming the second through-hole passing through the sacrificial layer and the second insulating layer of the chip region using the second photoresist pattern as an etch mask; and
removing the second photoresist pattern and the sacrificial layer to expose the first through-hole in the scribe lane region.

3. The method of claim 1, further comprising:
forming a diffusion prevention layer and a pad seed layer between the diffusion prevention layer and the pad metal layer inside the first through-hole in the chip region and the scribe lane region and the second through-hole and on the upper surface of the polishing layer,
wherein the polishing of the polishing layer and the pad metal layer by the CMP process includes:
removing the pad metal layer formed on the upper surface of the polishing layer; and
removing the pad metal layer located inside the first through-hole in the chip region and the scribe lane region and the second through-hole together with the polishing layer.

4. The method of claim 3, wherein an insulating recess is formed in the second insulating layer at a position corresponding to the first through-hole in the scribe lane region.

5. The method of claim 1, further comprising forming an oxide layer on the upper surface of the second insulating layer during the CMP process.

6. The method of claim 1, wherein the first through-hole formed in the chip region and the first through-hole formed in the scribe lane region have the same hole density.

7. The method of claim 1, wherein the first through-hole formed in the chip region and the first through-hole formed in the scribe lane region have the same shape in a top view and a plurality of first through-holes formed in the chip region are spaced apart from each other by the same distance.

8. The method of claim 1, wherein the first through-hole formed in the chip region and the first through-hole formed in the scribe lane region have different shapes in a top view and the same hole density.

9. The method of claim 1, wherein the first through-hole formed in the chip region and the first through-hole formed in the scribe lane region have vertical cross-sectional areas with different shapes and the same hole density.

10. The method of claim 1, wherein the forming of the first through-hole and the second through-hole includes:
forming the first through-hole in the polishing layer of the chip region and the second through-hole in the second insulating layer using a first photoresist pattern formed on the upper surface of the polishing layer as an etch mask;
depositing a sacrificial layer on the upper surface of the polishing layer and inside the first through-hole and the second through-hole and forming a second photoresist pattern on an upper surface of the sacrificial layer;
forming the first through-hole in the polishing layer in the scribe lane region using the second photoresist pattern as an etch mask; and
removing the second photoresist pattern and the sacrificial layer to expose the first through-hole and the second through-hole in the chip region.

11. The method of claim 10, further comprising forming a diffusion prevention layer and a pad seed layer between the diffusion prevention layer and the pad metal layer inside the first through-hole and the second through-hole and on the upper surface of the polishing layer.

12. The method of claim 10, wherein the polishing of the polishing layer and the pad metal layer by the CMP process includes:
removing the pad metal layer formed on the upper surface of the polishing layer; and
removing the pad metal layer located inside the first through-hole and the second through-hole together with the polishing layer.

13. The method of claim 10, wherein an insulating recess is formed in the upper surface of the second insulating layer at a position corresponding to the first through-bole in the scribe lane region.

14. A method for wafer planarization, comprising:
forming a substrate including a chip region and a scribe lane region;
forming an insulating layer on the substrate;
forming a polishing layer on the insulating layer;
forming a plurality of first through-holes in the polishing layer in the scribe lane region and the chip region, wherein each of the first through-holes in the chip region are spaced apart from each other by the same distance;
forming a plurality of second through-holes in the insulating layer in the chip region, wherein each of the second through-holes has a top view that is identical to that of the first through-holes throughout the chip region, and only one second through-hole corresponds to one first through-hole throughout the chip region;
forming a pad metal layer in the first and second through-holes and on the polishing layer; and
polishing the pad metal layer to expose a surface of the insulating layer in the chip region and the scribe lane region,
wherein the second through-hole is not formed in the scribe lane region,
wherein the second through-holes are the only through-holes in the insulating layer in the chip region,
wherein the insulating layer in the scribe lane region does not include any through-holes.

15. The method of claim 14, wherein the pad metal layer is polished by a chemical mechanical polishing (CMP) process.

16. The method of claim 14, wherein the entire surface of the insulating layer is exposed by polishing the pad metal layer.

17. The method of claim 14, wherein the surface of the insulating layer includes a recess in the scribe lane region, and the surface of the insulating layer does not include the recess in the chip region.

18. The method of claim 14, wherein corresponding pairs of the first through-hole and the second through-hole form an opening to receive the pad metal layer in the chip region.

* * * * *